(12) United States Patent
Suminoe et al.

(10) Patent No.: US 7,091,616 B2
(45) Date of Patent: Aug. 15, 2006

(54) SEMICONDUCTOR DEVICE HAVING A LEADING WIRING LAYER

(75) Inventors: Shinji Suminoe, Tenri (JP); Hiroyuki Nakanishi, Nara (JP); Toshiya Ishio, Nabari (JP); Yoshihide Iwazaki, Tenri (JP); Katsunobu Mori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/163,492

(22) Filed: Jun. 7, 2002

(65) Prior Publication Data

US 2003/0025173 A1 Feb. 6, 2003

(30) Foreign Application Priority Data

Aug. 1, 2001 (JP) ............................. 2001-234263

(51) Int. Cl.
*H01L 23/48* (2006.01)

(52) U.S. Cl. ...................... 257/773; 257/758; 257/737; 257/751

(58) Field of Classification Search ................ 257/780, 257/751, 737, 758, 773, 752, 767, 784; 438/612–614, 438/627, 643, 653, 927
See application file for complete search history.

(56) References Cited

U.S. PATENT DOCUMENTS

| | | | | |
|---|---|---|---|---|
| 4,836,883 A | * | 6/1989 | Hatcher, Jr. .................. | 438/17 |
| 5,293,071 A | * | 3/1994 | Erdos ........................... | 257/737 |
| 5,451,551 A | * | 9/1995 | Krishnan et al. ........... | 438/626 |
| 5,523,626 A | * | 6/1996 | Hayashi et al. ............. | 257/763 |
| 5,604,379 A | * | 2/1997 | Mori ........................... | 257/738 |
| 6,083,820 A | * | 7/2000 | Farnworth .................. | 438/614 |
| 6,110,648 A | * | 8/2000 | Jang ............................ | 430/312 |
| 6,111,317 A | * | 8/2000 | Okada et al. ................ | 257/737 |
| 6,218,281 B1 | * | 4/2001 | Watanabe et al. ........... | 438/612 |
| 6,376,353 B1 | * | 4/2002 | Zhou et al. ................. | 438/612 |
| 6,413,851 B1 | * | 7/2002 | Chow et al. ................ | 438/613 |
| 6,445,069 B1 | * | 9/2002 | Ling et al. .................. | 257/738 |
| 6,455,408 B1 | * | 9/2002 | Hwang et al. .............. | 438/613 |
| 6,472,763 B1 | * | 10/2002 | Fukuda et al. .............. | 257/780 |
| 6,479,900 B1 | * | 11/2002 | Shinogi et al. ............. | 257/758 |
| 6,515,372 B1 | * | 2/2003 | Narizuka et al. ........... | 257/779 |
| 6,551,872 B1 | * | 4/2003 | Cunningham ............... | 438/225 |
| 6,569,767 B1 | * | 5/2003 | Fujisawa et al. ............ | 438/687 |
| 6,576,381 B1 | * | 6/2003 | Hirano et al. ................. | 430/11 |
| 6,656,758 B1 | * | 12/2003 | Shinogi et al. ............... | 438/33 |
| 6,656,828 B1 | * | 12/2003 | Maitani et al. ............. | 438/613 |
| 6,713,381 B1 | * | 3/2004 | Barr et al. .................. | 438/622 |
| 2002/0014705 A1 | | 2/2002 | Ishio et al. | |

FOREIGN PATENT DOCUMENTS

JP 10-261663 A 9/1998

\* cited by examiner

*Primary Examiner*—Eugene Lee
(74) *Attorney, Agent, or Firm*—Birch, Stewart, Kolasch & Birch, LLP

(57) ABSTRACT

A leading wiring layer is provided with a main conductor layer, a first barrier metal layer for covering bottom and side surfaces of the main conductor layer, and a second barrier metal layer for covering a top surface of the main conductor layer. This ensures the respective barrier metal layers to cover entire surroundings including the side, bottom and top surfaces of the main conductor layer.

16 Claims, 8 Drawing Sheets

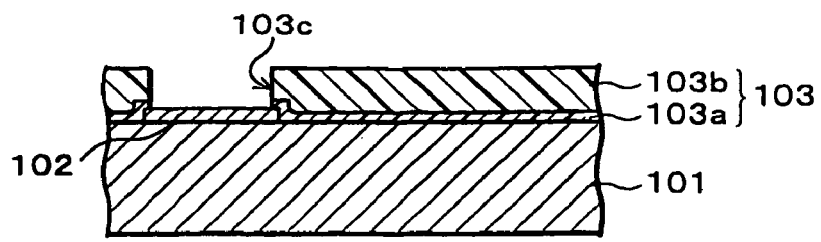
FIG. 8 (a) PRIOR ART
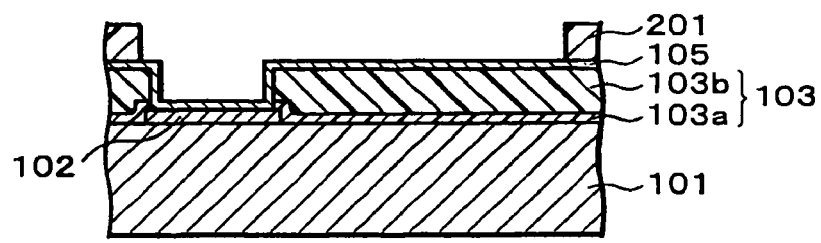
FIG. 8 (b) PRIOR ART
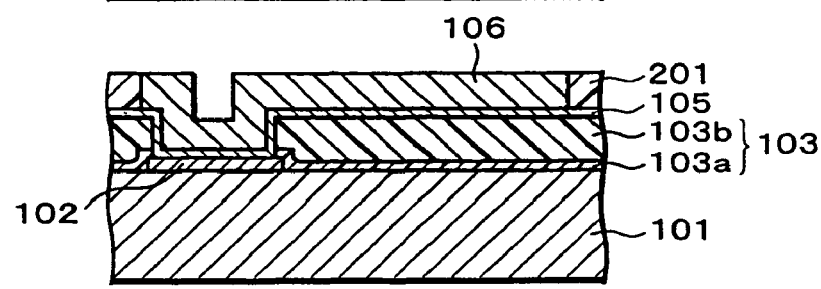
FIG. 8 (c) PRIOR ART
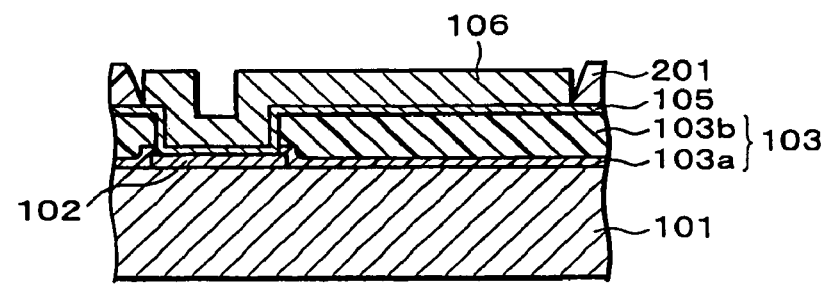
FIG. 8 (d) PRIOR ART
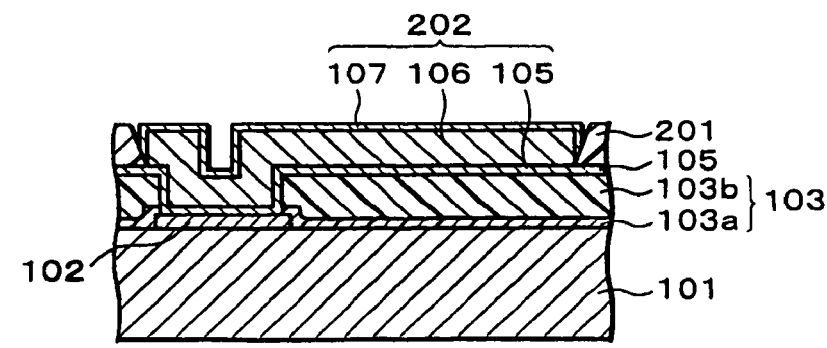
FIG. 8 (e) PRIOR ART

SEMICONDUCTOR DEVICE HAVING A LEADING WIRING LAYER

FIELD OF THE INVENTION

The present invention relates to a semiconductor device in which an external connecting terminal and an electrode pad formed on a semiconductor substrate are connected via a leading wiring layer and to its manufacturing method.

BACKGROUND OF THE INVENTION

Nowadays, as electronic devices are getting smaller in size and lighter in weight, as represented by a portable device or a mobile device, a semiconductor package used for them is also required to be smaller in size and lighter in weight.

In order to satisfy the demand, a semiconductor package having approximately the same size as a semiconductor chip (hereinafter referred to as a chip), namely a CSP (Chip Size Package) appears and comes into practical use.

Now, the mainstream form of the CSP is a face-up structure using a wire bonding technique. In the CSP, however, after mounting the chip on a substrate called as an interposer, wire bonding is carried out between a wire bonding terminal on the interposer, which is located outside the chip mounted section and an electrode pad on the chip. This makes the chip size a little larger than the size of the semiconductor package.

For this reason, technique called a wafer level CSP is now attracting attention, which can be further smaller in size and lighter in weight than the CSP of the wire bonding type, can be packaged in a same size as the chip size, and can be manufactured more inexpensively.

Tokukaihei No. 10-261663 (publication date: Sep. 29, 1998) discloses a structure and a manufacturing method of the wafer level CSP. FIG. 7 shows a semiconductor device 113 to which the technique in the publication is applied. The diagram is a vertical sectional view showing a part of the semiconductor device 113 having a plurality of external connecting terminals 110.

In the semiconductor device 113, a first insulation layer 103 is formed on a semiconductor substrate 101 having a plurality of electrode pads 102. The first insulation layer 103 is composed of an inorganic insulation layer 103a and an organic insulation layer 103b.

The first insulation layer 103 is partly eliminated to form a first opening section 103c, thereby exposing the electrode pad 102. The electrode pad 102 is connected with the external connecting terminal 110 via a leading wiring layer 112. One terminal of the leading wiring layer 112 is connected on the electrode pad 102, whereas the other terminal is connected with the external connecting terminal 110.

The leading wiring layer 112 is composed of a first barrier metal layer 105, a main conductor layer 106 and a second barrier metal layer 107. The first barrier metal layer 105 covers a bottom surface of the main conductor layer 106, while the second barrier metal layer 107 covers a top surface of the main conductor layer 106.

On the first insulation layer 103, a second insulation layer 109 is provided so as to cover side and top surfaces of the leading wiring layer 112. The second insulation layer 109 includes a second opening section 109b where the external connecting terminal 110 is provided.

A material for the first barrier metal layer 105 is required to be metal having high adhesion to the organic insulation layer 103b, because low adhesion causes lower reliability of the semiconductor device 113.

A material for the main conductor layer 106 is required to be metal having high conductivity, in order to reduce resistance of the whole leading wiring layer 112.

A material for the second barrier metal layer is required to be metal having high hardness, so as to protect the semiconductor substrate 101 from breaking when a wire (not shown) is connected to the external connecting terminal 110.

As described above, in the leading wiring layer 112, since the second barrier metal layer 107 and the first barrier metal layer 105 are formed on the top and bottom surfaces of the main conductor layer 106 having high conductivity, namely low resistance, it is possible to restrain electromigration of the second insulation layer 109 and the first insulation layer 103.

However, in the conventional arrangement, as shown in FIG. 7, exposure of side surfaces of the main conductor layer 106 causes a problem that electromigration occurs with the second insulation layer 109 on side surfaces of the leading wiring layer 112.

Furthermore, during a manufacturing step of the semiconductor device 113, the main conductor layer 106 and the second insulation layer 109 have low adhesion, thereby causing a problem that the reliability of the semiconductor device 113 is lowered.

For trying to solve the problems, the publication discloses a semiconductor device in which side surfaces of the main conductor layer 106 are also covered with the second barrier metal layer 107. FIGS. 8(a) to 8(e) outline its manufacturing method.

Note that, for convenience, the same reference numerals are assigned to members which have same functions as those used in FIG. 7, and thus their explanation is omitted.

First, as shown in FIG. 8(a), the inorganic insulation layer 103a and the organic insulation layer 103b are formed on the semiconductor substrate 101 having a semiconductor element (not shown) and the plurality of electrode pads 102, and then the first opening section 103c is formed on the electrode pads 102. Next, the first barrier metal layer 105 is formed by sputtering or evaporation.

Next, a resist 201 is formed on the first barrier metal layer 105, and then the resist 201 is exposed and developed, thereby eliminating the resist 201 in an area where the leading wiring layer 112 (see FIG. 7) is formed.

Because of this, as shown in FIG. 8(b), the resist 201 remains only in areas where wiring is not formed. Next, as shown in FIG. 8(c), the main conductor layer 106 is formed by an electrolytic plating (electric plating) method or an electroless plating method.

Here, heating at 150° C. contracts the resist 201, thereby providing a space between the main conductor layer 106 and the resist 201, as shown in FIG. 8(d). Next, as shown in FIG. 8(e), the second barrier metal layer 107 is formed by the electrolytic plating method or the electroless plating method.

After that, the resist 201 is eliminated, and the first barrier metal layer 105 is etched with using the second barrier metal layer 107 and the main conductor layer 106 as masks, thereby forming the leading wiring layer 202.

Because of this, since the second barrier metal layer 107 or the first barrier metal layer 105 is formed on the respective side, top, and bottom surfaces of the main conductor layer 106 having high conductivity, it is possible to restrain electromigration of the second insulation layer 109 (see FIG. 7) and the first insulation layer 103.

In the method of contracting the resist 201 as described above, however, even though an upper portion of the resist 201 is contracted, due to adhesion to the first barrier metal layer 105, a lower portion of the resist 201 is difficult to be contracted, or only possibly contracted a very small amount.

Therefore, on lower portions of the side surfaces of the main conductor layer 106, the barrier metal layer is not plated, or only plated very thinly, thus leaving reliability of the leading wiring layer 202 low.

SUMMARY OF THE INVENTION

The object of the present invention is to provide a semiconductor device having high reliability and a manufacturing method thereof, by surely (a) preventing electromigration of the leading wiring layer and the insulation layer, and (b) maintaining adhesion of the leading wiring layer to the insulation layer, regardless of where the insulation layer is located around the leading wiring, in a semiconductor device in which an electrode pad, an insulation layer, a leading wiring layer, and an external connecting terminal are formed on a semiconductor substrate.

In order to achieve the object, the semiconductor device of the present invention is a semiconductor device in which an external connecting terminal and an electrode pad formed on a semiconductor substrate are connected via a leading wiring layer, and the electrode pad and the leading wiring layer are covered with an insulation layer, wherein the leading wiring layer includes a main conductor layer, a first barrier metal layer for covering bottom and side surfaces of the main conductor layer, and a second barrier metal layer for covering a top surface of the main conductor layer, and the first barrier metal layer and the second barrier metal layer cover entire surroundings including the side, bottom and top surfaces of the main conductor layer.

According to the arrangement, the semiconductor device of the present invention is manufactured in such a manufacturing step that the first barrier metal layer is formed at a position to cover the bottom and side surfaces of the main conductor layer, the main conductor layer is formed on the first barrier metal layer, and then the second barrier metal layer is formed on the main conductor layer. The manufacturing step is concretely described as follows.

Namely, the first barrier metal layer in a concave shape is first formed, in which the main conductor layer is then formed. Following this, the second barrier metal layer in a plain shape is formed to cover the surface of the main conductor layer formed in the first barrier metal layer and the top surface of the first barrier metal layer.

Manufactured in the above-described manufacturing step, in the present semiconductor device, the first barrier metal layer and the second barrier metal layer can easily and surely cover all around the main conductor layer including the side, bottom and top surfaces.

This ensures the main conductor layer to be coated with the barrier metal layers so as not to contact the insulation layers, thereby preventing the electromigration between the main conductor layer and the insulation layers.

Furthermore, surely coated with the barrier metal layers, the main conductor layer is not subjected to oxidation or corrosion, thereby maintaining adhesion between the leading wiring layer composed of the main conductor layer and the first and the second barrier metal layers, and the insulation layers. This improves reliability of the semiconductor device, as a result.

For a fuller understanding of the nature and advantages of the invention, reference should be made to the ensuing detailed description taken in conjunction with the accompanying drawings.

BRIEF DESCRIPTION OF THE DRAWINGS

FIG. 2(a) shows a forming step of an electrode pad and an inorganic insulation layer on a semiconductor substrate, FIG. 2(b) shows a forming step of an organic insulation layer, FIG. 2(c) shows a forming step of a second insulation layer, FIG. 2(d) shows a forming step of a base layer of a main conductor layer, and FIG. 2(e) shows a forming step of a metal film for a main layer of the main conductor layer.

FIG. 3(a) shows a forming step of the main layer of the main conductor layer, FIG. 3(b) shows a forming step of a second barrier metal layer and a metal layer, FIG. 3(c) shows a forming step of a third insulation layer, and FIG. 3(d) shows a forming step of an external connecting terminal.

FIG. 4(a) shows a forming step of an electrode pad and an inorganic insulation layer on a semiconductor substrate, FIG. 4(b) shows a forming step of an organic insulation layer, FIG. 4(c) shows a forming step of a second insulation layer, FIG. 4(d) shows a forming step of a base layer of a main conductor layer, and FIG. 4(e) shows a forming step of a main layer of the main conductor layer, a second barrier metal layer, and a metal layer.

FIG. 5(a) shows a polishing step of the second barrier metal layer and the metal layer, FIG. 5(b) shows a reforming step of the second barrier metal layer, FIG. 5(c) shows a forming step of a third insulation layer, and FIG. 5(d) shows a forming step of an external connecting terminal.

FIG. 6(a) shows a manufacturing step of a conventional semiconductor device, FIG. 6(b) shows a manufacturing step of the semiconductor device in accordance with the embodiment of the present invention, and FIG. 6(c) shows another manufacturing step of the semiconductor device in accordance with the embodiment of the present invention.

FIGS. 8(a) through 8(e) are vertical sectional views showing another manufacturing step of the conventional semiconductor device. FIG. 8(a) shows a forming step of an electrode pad, an inorganic insulation layer and an organic insulation layer on a semiconductor substrate, FIG. 8(b) shows a forming step of a first barrier metal layer and a resist for forming a main conductor layer, FIG. 8(c) shows a forming step of the main conductor layer, FIG. 8(d) shows a heating step of the resist, and FIG. 8(e) shows a forming step of a second barrier metal layer.

DESCRIPTION OF THE EMBODIMENTS

An embodiment of the present invention is explained as follows, referring to FIGS. 1 through 6.

Figure 1:
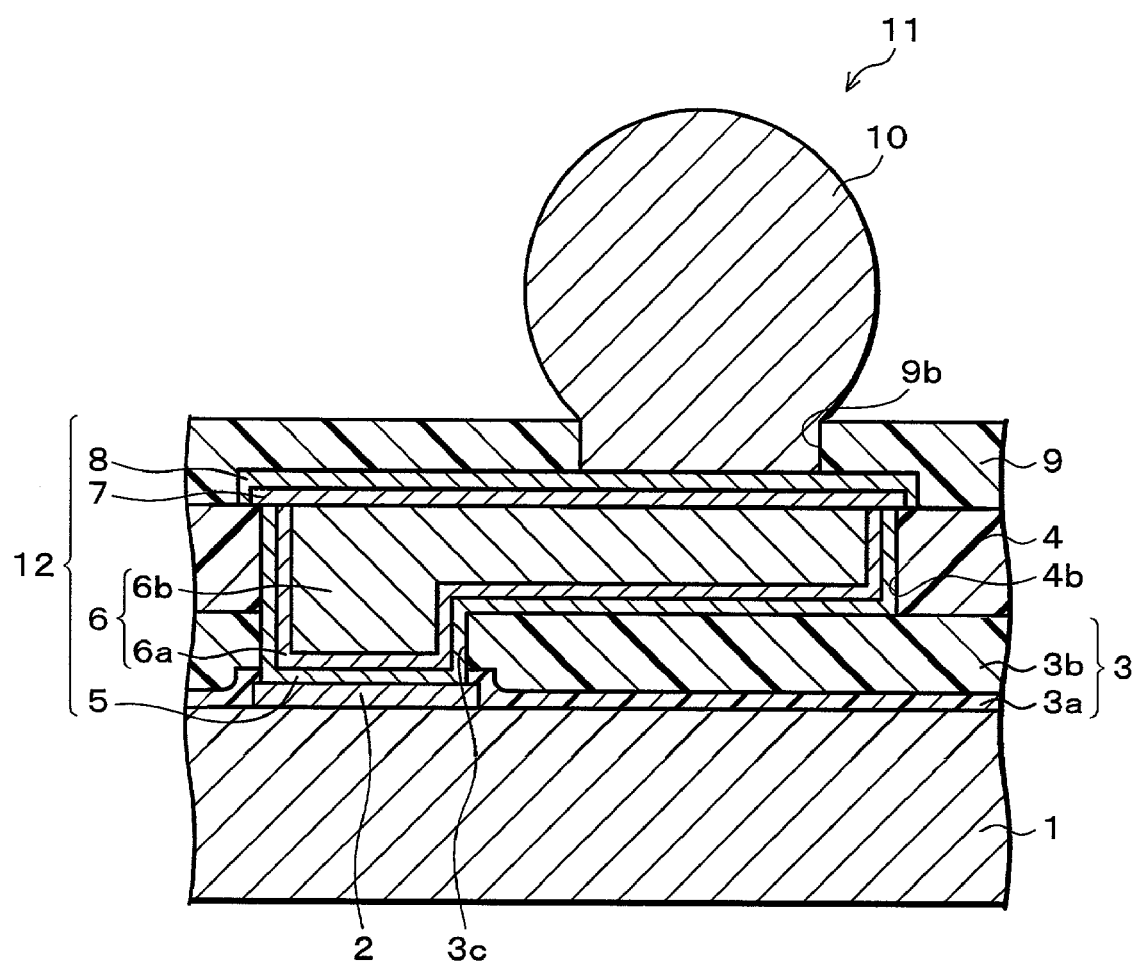
FIG. 1 is a vertical sectional view of a semiconductor device in accordance with an embodiment of the present invention.
Figure 2:
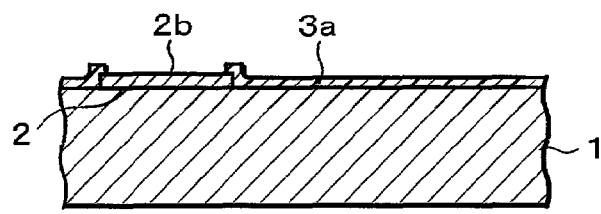
FIGS. 2(a) through 2(e) are vertical sectional views showing a manufacturing step of the semiconductor device shown in FIG. 1.
Figure 2:
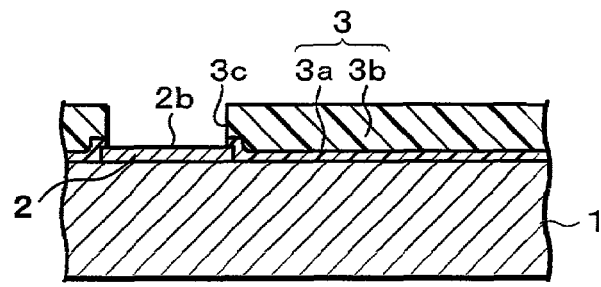
Figure 2:
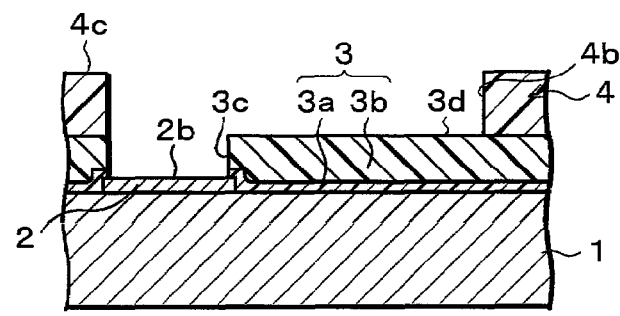
Figure 2:
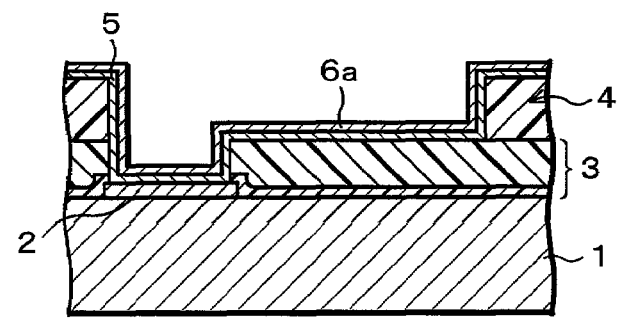
Figure 2:
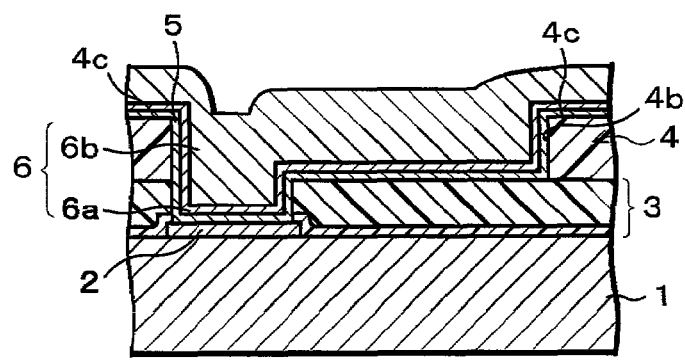
Figure 3:
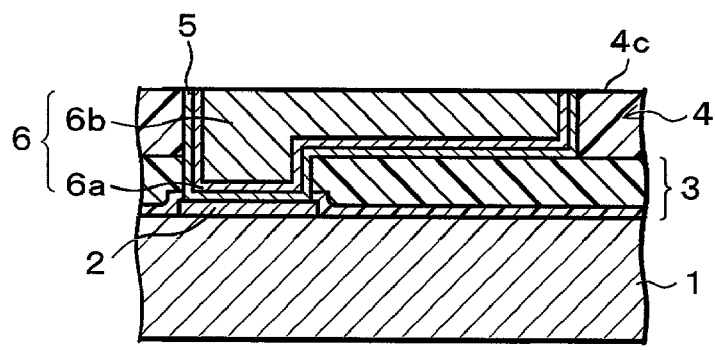
FIGS. 3(a) through 3(d) are vertical sectional views showing a manufacturing step following the manufacturing step shown in FIGS. 2(a) through 2(e).
Figure 3:
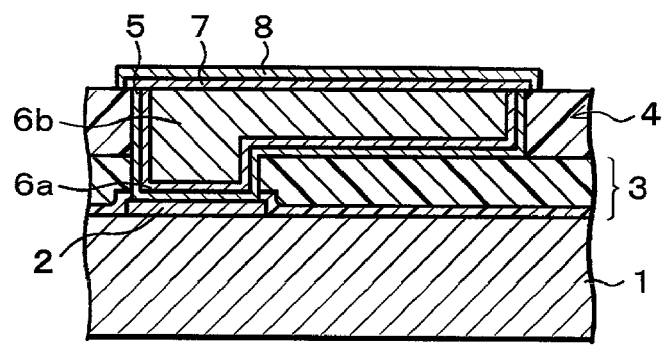
Figure 3:
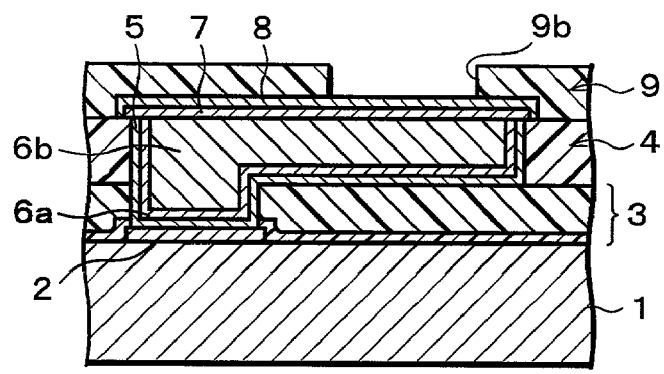
Figure 3:
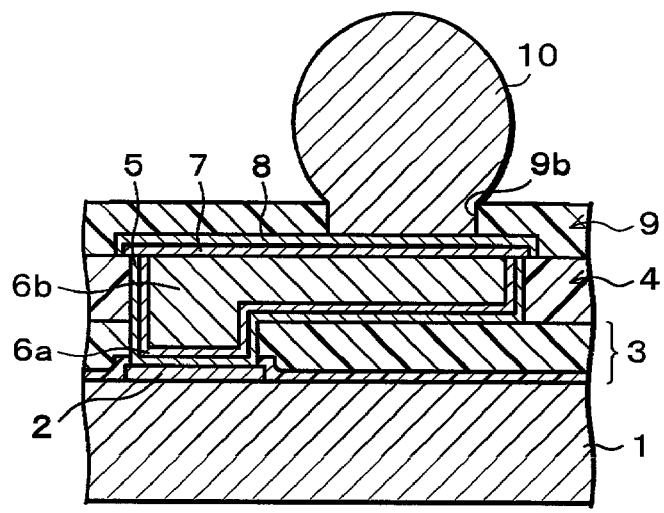
Figure 4:
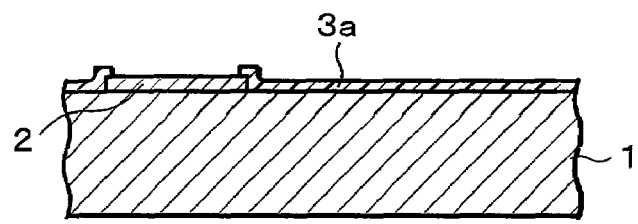
FIGS. 4(a) through 4(e) are vertical sectional views showing another manufacturing step of the semiconductor device in accordance with the embodiment of the present invention.
Figure 4:
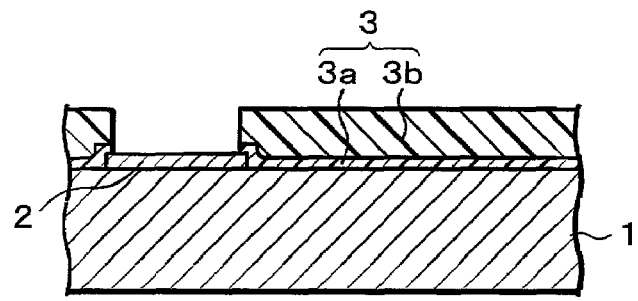
Figure 4:
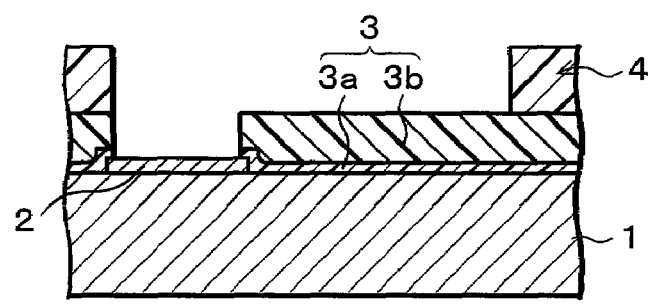
Figure 4:
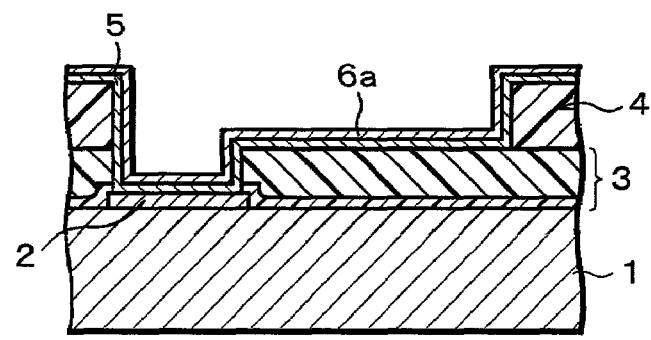
Figure 4:
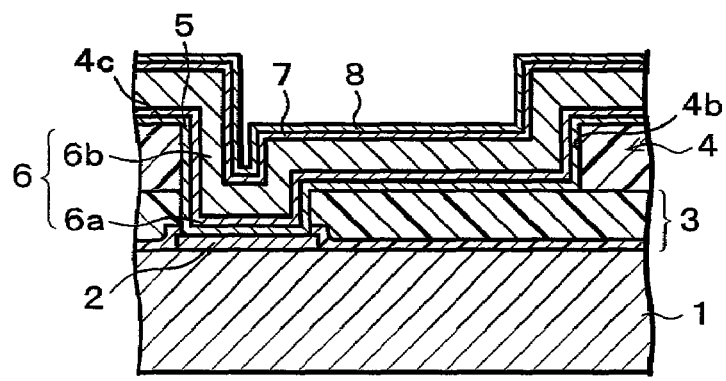
Figure 5:
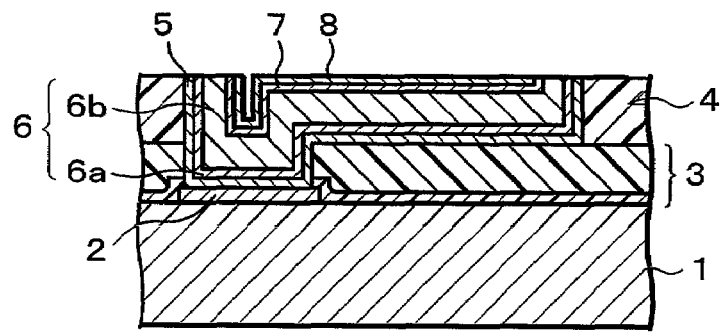
FIGS. 5(a) through 5(d) are vertical sectional views showing a manufacturing step following the manufacturing step shown in FIGS. 4(a) through 4(e).
Figure 5:
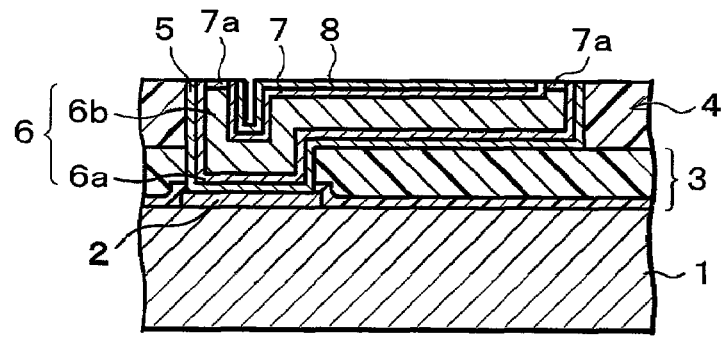
Figure 5:
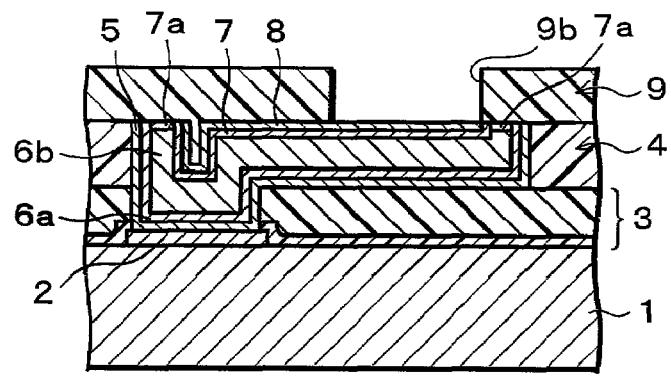
Figure 5:
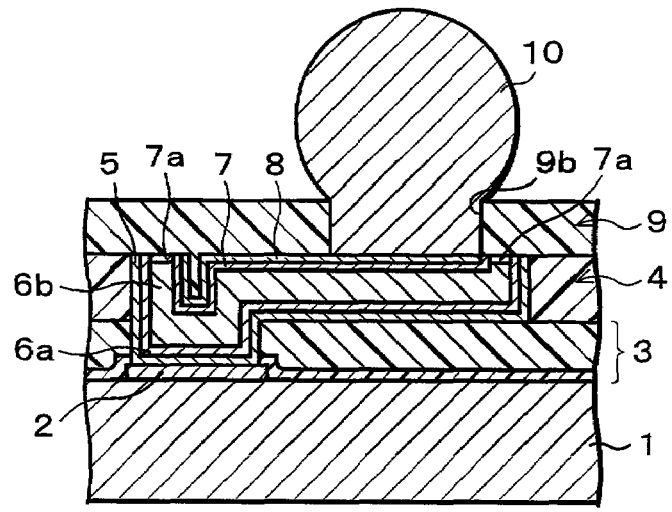
Figure 6:
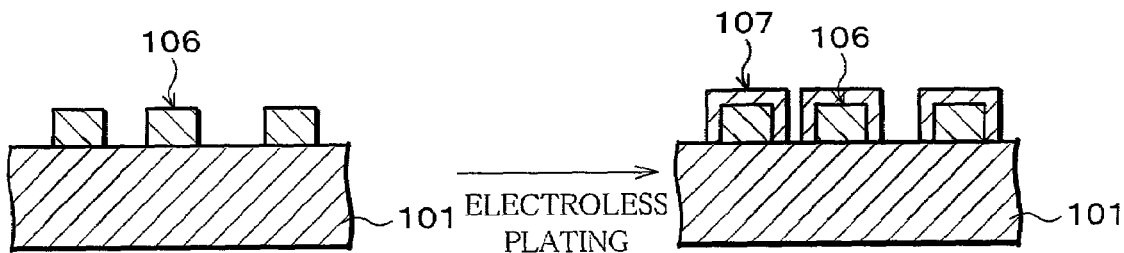
FIGS. 6(a) through 6(c) are cross sectional views showing an outline of a manufacturing step in which the second barrier metal layer is formed on a top surface of the main conductor layer by an electroless plating method.
Figure 6:
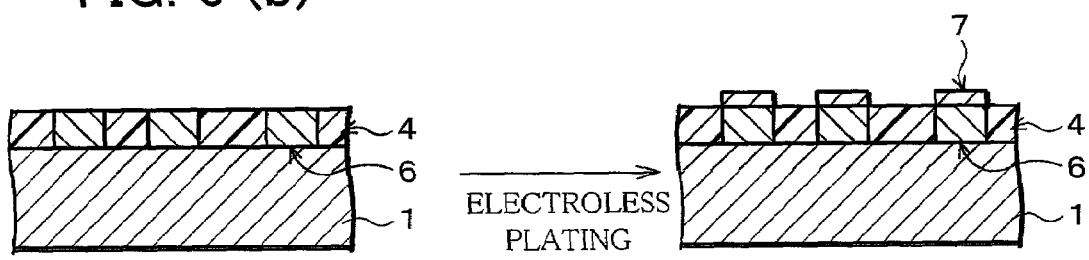
Figure 6:
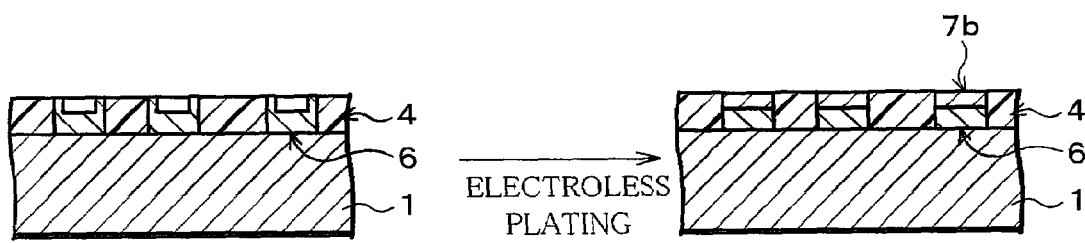
Figure 7:
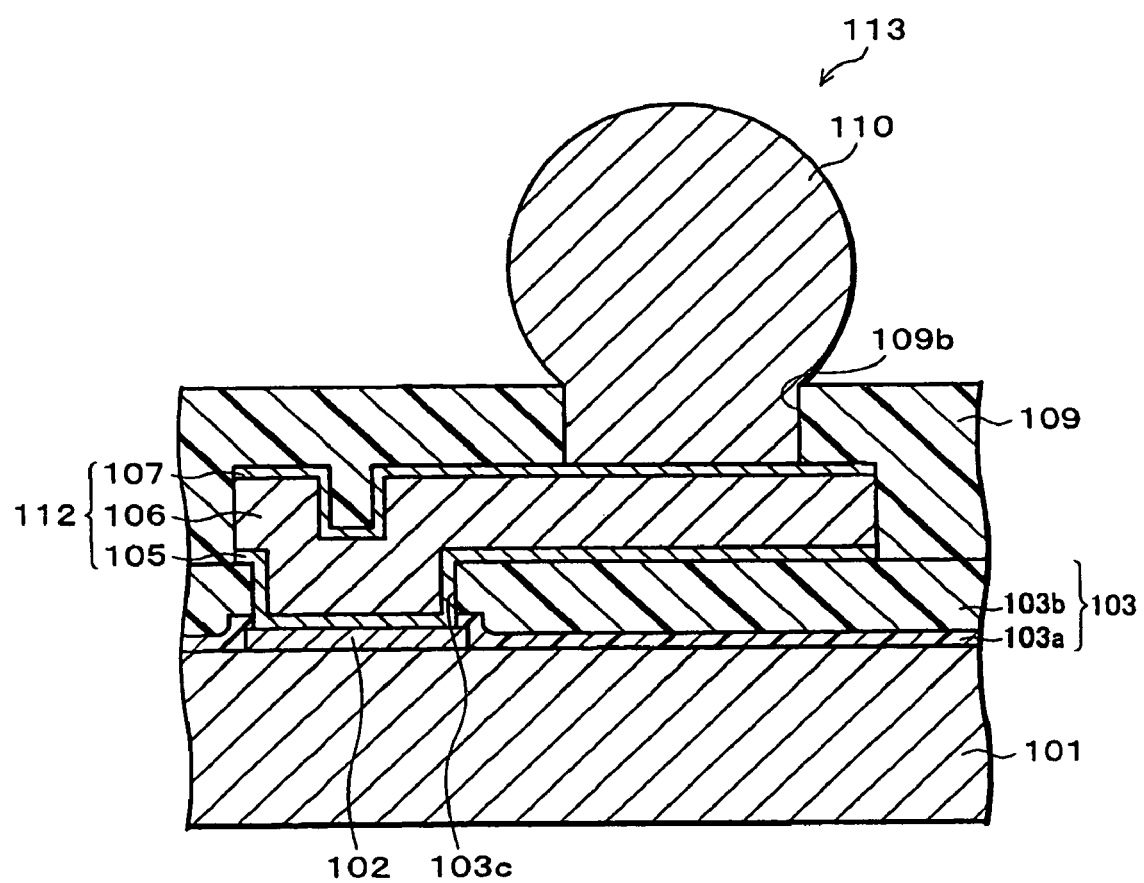
FIG. 7 is a vertical sectional view of a conventional semiconductor device.

FIG. 1 shows a cross sectional structure of a main part in a semiconductor device 11 in accordance with the embodiment of the present invention.

As shown in FIG. 1, the semiconductor device 11 is provided with a semiconductor substrate 1, a plurality of electrode pads 2, a first insulation layer 3, a second insulation layer 4, a leading wiring layer 12, a third insulation layer 9, and a plurality of external connecting terminals 10.

The plurality of electrode pads 2 and the first insulation layer 3 having a first opening section 3c in an area of the electrode pads 2 are formed on the semiconductor substrate 1. The first insulation layer 3 is composed of an inorganic insulation layer 3a and an organic insulation layer 3b formed on the inorganic insulation layer 3a.

The leading wiring layer 12 is formed on the electrode pad 2 and the first insulation layer 3. The leading wiring layer 12 electrically connects the electrode pad 2 and the external connecting terminal 10. In the leading wiring layer 12, one edge portion is connected on the electrode pad 2, whereas the other edge portion is connected to the external connecting terminal 10.

The leading wiring layer 12 includes a first barrier metal layer 5, a main conductor layer 6, a second barrier metal layer 7, and a metal layer 8. The main conductor layer 6 is a main metal layer occupying the most part of the leading wiring layer 12.

Bottom and side surfaces of the main conductor layer 6 are covered with the first barrier metal layer 5, whereas a top surface of the main conductor layer 6 is covered with the second barrier metal layer 7. The metal layer 8 is formed on the second barrier metal layer 7. The main conductor layer 6 is composed of a base layer 6a and a main layer 6b.

The second insulation layer 4, formed on the first insulation layer 3, covers side surfaces of the leading wiring layer 12. Therefore, the second insulation layer 4 has a second opening section 4b, which corresponds to a shape of the leading wiring layer 12.

The third insulation layer 9 is formed on the second insulation layer 4 and the leading wiring layer 12. The third insulation layer 9, having a third opening section 9b, covers the top surface of the leading wiring layer 12 except the third opening section 9b. The external connecting terminal 10 is formed at the third opening section 9b to connect with the leading wiring layer 12.

The electrode pad 2 is composed of Al (aluminum) or metal mainly composed of Al. The inorganic insulation layer 3a, which is formed in an area on the semiconductor substrate 1 other than the section of the electrode pad 2, is composed of an inorganic material mainly composed of silicone dioxide film or nitride film.

As the organic insulation layer 3b, non-photosensitive polyimide can be used, for example, which has low hygroscopicity and high chemical stability. Further, when it is necessary to prevent crosstalk of the leading wiring layer 12 and an element section inside the semiconductor, it is preferable to use a material having low dielectric constant, such as BCB (benzocyclobutene), as the organic insulation layer 3b.

The main conductor layer 6 is preferably composed of a metal having high conductivity, namely a material having low electric resistance, such as Cu (copper) for a purpose of reducing electric resistance of the whole leading wiring layer 12. Further, Cu can be formed to have a film thickness of a few μm by plating or other methods.

Note that, the base layer 6a of the main conductor layer 6 is a base metal layer for plating the main layer 6b. Therefore, the base layer 6a uses the same material as the main layer 6b. For example, when the main layer 6b is made of Cu, the base layer 6a is specified as Cu having a film thickness of approximately 1000 Å to 2000 Å formed by a sputtering method.

The first barrier metal layer 5 prevents lowering of the reliability of the semiconductor device 11, due to metal diffusion between Al of the electrode pad 2 and Cu of the main conductor layer 6, as well as metal diffusion of the main conductor layer 6 into the second insulation layer 4, for example.

In other words, the first barrier metal layer 5 prevents lowering of the reliability due to the following reasons, for example; (a) metal diffusion between Al and Cu creates a void, and (b) when the insulation layer is formed after Cu is formed, Cu diffuses into the insulation layer, because the Cu directly contacts the insulation layer, thereby deteriorating properties of the insulation layer.

Furthermore, the first barrier metal layer 5 preferably has a thick film in terms of maintaining a barrier against the diffusion, but on the other hand, preferably has a thin film in terms of influence of the electric resistance and stress.

Furthermore, the first barrier metal layer 5 is preferably composed of a material having high adhesion to the organic insulation layer 3b, because low adhesion will exfoliate the leading wiring layer 12 and the organic insulation layer 3b, thereby lowering the reliability of the semiconductor device 11.

In consideration of these requirements, the first barrier metal layer 5 is preferably Ti (titanium)—W (tungsten) having a layer thickness of approximately 500 Å to 2000 Å formed by the sputtering method, for example. Note that, the material of the first barrier metal layer 5 may be Ti, W, Cr (chromium), or their alloy.

The second barrier metal layer 7 prevents the diffusion of electrons between soldering of the external connecting terminal 10 and Cu of the main conductor layer 6, for example, and further prevents electromigration between the second insulation layer 4 and Cu of the main conductor layer 6.

A material of the second barrier metal layer 7 is preferably Ni (nickel) of approximately 5 μm, for minimizing increase of electric resistance.

The metal layer 8 prevents poor connecting in soldering of the external connecting terminal 10 due to oxidation of Ni of the second barrier metal layer 7, and further prevents formation of a fragile layer of tin alloy at an interface of the soldering and Ni. Therefore, the metal layer 8 needs to be formed at least between the second barrier metal layer 7 and the external connecting terminal 10.

A material of the metal layer 8 is preferably Au (gold), or platinum group such as palladium (Pd) and platinum (Pt), having a layer thickness of approximately 0.003 μm to 0.100 μm.

A material of the second insulation layer 4 preferably has low cost in terms of the cost, and preferably has a property for being easily polished in terms of manufacturing. Further, the material of the second insulation layer 4 preferably has high adhesion to the organic insulation layer 3b in terms of improving the reliability of the semiconductor device 11. According to the above viewpoints, the material of the second insulation layer 4 is preferably a photosensitive novolak resin, for example.

A material of the third insulation layer 9 is preferably a material having high adhesion to the second insulation layer 4, the second barrier metal layer 7 and the metal layer 8, such as photosensitive polyimide or novolak resin, for example.

The external connecting terminal 10, which is provided in correspondence with each electrode pad on the semiconductor substrate, is connected with the leading wiring layer 12.

A material and a shape of the external connecting terminal 10 may be eutectic soldering of Sn (tin)—Pb (lead), a solder ball composed of lead free soldering such as Sn—Ag (silver)—Cu, or a bump made of Au.

According to the semiconductor device 11 having the above arrangement, the whole surface of the main conductor layer 6 is covered with the first barrier metal layer 5 and the second barrier metal layer 7, which are composed of a metal having different physical properties from the main conductor layer 6. In other words, the main conductor layer 6 does not contact the insulation layers (the first to the third insulation layers 3, 4 and 9), and the first barrier metal layer 5 and the second barrier metal layer 7 prevent the main conductor layer 6 from eluting into the insulation layers.

Furthermore, the first barrier metal layer 5 and the second barrier metal layer 7 coat the whole surface of the main conductor layer 6 so as to prevent the main conductor layer 6 from being oxidized or corroded, and to maintain adhesion of the leading wiring layer 12 to the insulation layers.

This can evenly prevent the main conductor layer 6 from diffusing regardless of where the insulation layers are located around the main conductor layer 6. Further, it is also possible to evenly maintain adhesion of the leading wiring layer 12 to the first, the second, and the third insulation layers 3, 4 and 9 regardless of where the insulation layers are located around the main conductor layer 6. This improves the reliability of the semiconductor device 11.

In the semiconductor device 11, since the leading wiring layer 12 is so structured that the main conductor layer 6 is covered with the first barrier metal layer 5 and the second barrier metal layer 7, a semiconductor device in which the main conductor layer 6 is properly covered with the first barrier metal layer 5 and the second barrier metal layer 7 can be easily manufactured, as described later.

Next, a manufacturing method of the semiconductor device 11 is explained based on a process drawing shown in FIGS. 2(a) through 2(e) and FIGS. 3(a) through 3(d).

First, as shown in FIG. 2(a), a semiconductor element (not shown), the electrode pad 2, and the inorganic insulation layer 3a are formed on the semiconductor substrate 1. Next, in order to form the organic insulation layer 3b, liquid material, such as non-photosensitive polyimide, is applied on the semiconductor substrate 1 by a spin coating method, which is then subjected to provisional hardening by pre-baking (heat processing). A photosensitive resist (not shown) is applied on it in a same manner, which is then subjected to provisional hardening.

Next, a pattern is exposed on the resist after the provisional hardening by using an aligner, a stepper and the like. After the exposure, the resist on a surface section 2b of the electrode pad 2 and the resist of other unnecessary portions as the organic insulation layer 3b are solubilized and then eliminated by development.

Next, by using alkaline developing solution, the organic insulation layer 3b on the surface section 2b of the electrode pad 2 and on other unnecessary portions of the organic insulation layer 3b are eliminated. Then the resist is eliminated by exfoliation solution, and the organic insulation layer 3b is subjected to closed circular by baking (heat processing) at 250° C. to 350° C., so as to form the first insulation layer 3 having the first opening section 3c.

Next, a material of the second insulation layer 4 such as photosensitive novolak resin, for example, is applied by the spin coating method in the similar method as the organic insulation layer 3b so as to form the resin layer for the second insulation layer 4, which is then subjected to exposure and development. Then, with the developing solution, eliminated are in the resin layer the surface section 2b of the electrode pad 2 and a portion where the leading wiring layer 12 is formed. After that, the remained resin layer is baked and subjected to closed circular, to form the second insulation layer 4 having the second opening section 4b, as shown in FIG. 2(c).

Next, the first barrier metal layer 5 is formed by the sputtering method on a top surface of the semiconductor substrate 1 shown in FIG. 2(c), that is, the surface section 2b of the electrode pad 2 (the exposed portion), a first opening section 3c, an exposed section 3d of the organic insulation layer 3b, the second opening section 4b, and a top surface section 4c of the second insulation layer 4. Then, as shown in FIG. 2(d), the bedding layer 6a of the main conductor layer 6 is formed on the first barrier metal layer 5 by the sputtering method.

Next, as shown in FIG. 2(e), a metal film having a thickness of 5 μm to 15 μm, which is a material of the main layer 6b, is formed on whole surface of the semiconductor substrate by plating, and then eliminated are in the metal film the parts above the top surface section 4c of the second insulation layer 4, as shown in FIG. 3(a). There are three eliminating methods as follows.

First method: the metal film is eliminated from the top surface by a mechanical polishing method such as CMP to a position at which the top surface section 4c is exposed.

Second method: the main conductor layer 6 is chemically etched by using etching solution of persulfate, perhydrogen sulfate or iron chloride, and then the first barrier metal layer 5 is similarly eliminated by the chemical etching.

In this case, when the plating film of the main layer 6b is formed, metal of the main layer 6b is required to be selectively deposited (by plating) at a position where the main conductor layer 6 is to be formed (see FIG. 3(a)). The second method, however, can prevent damage to the second insulation layer 4, which is caused by polishing in the first method.

Furthermore, in the second method, the metal film is eliminated by the chemical etching so that polishing dust of the main layer 6b does not remain on the top surface section 4c of the second insulation layer 4. For this reason, in a post-treatment process when the second barrier metal layer 7 is formed (see FIG. 3(b)), it is possible to easily form fine wiring by the electroless plating method in comparison to the first method.

This is because, in the first method, plating of the fine wiring requires considerable care, since the polishing dust of the main layer 6b may remain on the top surface section 4c of the second insulation layer 4. In other words, when the polishing dust remains on the top surface section 4c of the second insulation layer 4, the remained portions of the polishing dust may also be subjected to plating.

Note that, in the second method, the main conductor layer 6, which has been subjected to the etching preferably has a position lower than the top surface section 4c of the second insulation layer 4, so as to form finer wiring by the electroless plating method in a post-treatment process described later.

Third method: selectively eliminated are in the metal film the parts above the top surface section 4c of the second insulation layer 4 by polishing as in the first method, whereas the metal film on the main conductor layer 6 and on the first barrier metal layer 5 are eliminated by the chemical etching as in the second method.

According to this method, not only when the main conductor layer 6 is selectively formed by the electroless plating method at the 6b section where the conductor layer is required, but also when the main conductor layer 6 is formed in an isotropic manner at a portion other than the 6b section, such as the top surface of the second insulation layer 4, the same result is obtained as in the second method.

Next, as shown in FIG. 3(b), the oxide film on the main conductor layer 6, which is formed during the chemical etching, is eliminated and then the second barrier metal layer 7 is formed by the electroless plating method. Following that, the metal layer 8 is formed on the whole top surface of the second barrier metal layer 7 by the electroless plating method.

Next, as shown in FIG. 3(c), the third insulation layer 9 having the third opening section 9b for the external connecting terminal 10 is formed. The third insulation layer 9, having the third opening section 9b is formed in such a method that the photosensitive liquid organic resin is applied, which is then subjected to the exposure, the development and the baking, like the second insulation layer 4.

Note that, before the third insulation layer 9 is formed, it is desirable to carry out plasma processing on surfaces, of the layers such as the second insulation layer 4 and the metal layer 8, contacting the third insulation layer 9. This improves adhesion of the third insulation layer 9 to the surfaces, of the layers such as the second insulation layer 4 and the metal layer 8, contacting the third insulation layer 9.

Further, though the extra steps are required, the third insulation layer 9 may be formed with using non-photosensitive organic resin instead of the photosensitive organic resin for a purpose of improving reliability or electric properties. In this case, as explained in the step shown in FIG. 2(a), the extra steps are required in which the photosensitive resist (not shown) is applied, provisionally hardened, and eliminated.

Next, as shown in FIG. 3(d), the external connecting terminal 10 is formed on the third opening section 9b formed in the third insulation layer 9.

Note that, when the third insulation layer 9 is formed without forming the metal layer 8 which is formed in the step shown in FIG. 3(b), the external connecting terminal 10 is formed in the following step. Namely, the metal layer 8 made of Au or platinum group is formed by the electroless plating method on the second barrier metal layer 7 which is exposed on the third opening section 9b, so as to mount a solder ball. Then reflow is carried out in a nitrogen atmosphere to form the external connecting terminal 10.

According to the above step, the metal layer for surely connecting the leading wiring layer 12 and the external connecting terminal 10 is formed only at the second barrier metal layer 7 which is exposed on the third opening section 9b.

In other words, the metal layer is formed only in an area where the external connecting terminal 10 is formed. Because of this, even if the metal layer 8 is incorporated in the external connecting terminal 10 by diffusion when the external connecting terminal 10 is formed, this does not create a void between the third insulation layer 9 and the main conductor layer 6, thereby preventing the lowering of the reliability.

Note that, the third insulation layer 9 is not required when using a method other than the method in which the external connecting terminal 10 is formed by the reflow of the solder ball.

According to the manufacturing method of the semiconductor device explained in FIGS. 2(a) through 2(e) and FIGS. 3(a) through 3(d), the first and the second barrier metal layers 5 and 7 can surely coat the main conductor 6, and such a semiconductor device can be easily manufactured.

Therefore, it is possible to prevent diffusion between the main conductor layer 6 and the insulation layers 3, 4 and 9. Further, it is possible to prevent the main conductor layer 6 from being oxidized or corroded, and it is possible to obtain adhesion of the leading wiring layer 12 to the insulation layers 3, 4 and 9. Because of the above reasons, a semiconductor device having high reliability can be obtained.

Note that, the barriers formed between the main conductor layer 6 and the respective insulation layers 3, 4, and 9 may have the same thickness per the respective barrier metal layers 5 and 7.

Next, another manufacturing method of the semiconductor device 1 is explained based on a process drawing shown in FIGS. 4(a) to 4(e) and FIGS. 5(a) to 5(d). Note that, the formation of the first insulation layer 3 in FIGS. 4(a) and 4(b), the formation of the second insulation layer 4 in FIG. 4(c), the formation of the first barrier metal layer 5 in FIG. 4(d), and the formation of the bedding layer 6a are same as in respective step examples of FIGS. 2(a) to 2(d), thus their explanation is omitted here.

After forming the base layer 6a as shown in FIG. 4(d), the main layer 6b, the second barrier metal layer 7 and the metal layer 8 are sequentially formed, as shown in FIG. 4(e).

At this time, the metal layer 8 and the second barrier metal layer 7 formed in the second opening section 4b desirably have positions lower than the top surface section 4c of the second insulation layer 4. This prevents the main layer 6b from being exposed.

After this, mechanical polishing is carried out, thereby eliminating the parts in the second barrier metal layer 7 and the metal layer 8, which are located above the top surface section 4c of the second insulation layer 4 (see FIG. 5(a)). Then, in a part where the main conductor layer 6 is exposed, a third barrier metal layer 7a is formed again by an electroless substitute plating method, as shown in FIG. 5(b).

Note that, a material of the third barrier metal layer 7a is desirably the same material used in the second barrier metal layer 7 in terms of the step, but not limited to this. Further, as respective step examples shown in FIGS. 3(c) and 3(d), the third insulation layer 9 (see FIG. 5(c)) and the external connecting terminal 10 (see FIG. 5(d)) are formed.

As described above, also in the manufacturing method of the semiconductor device explained in FIGS. 4(a) through 4(e) and FIGS. 5(a) through 5(d), it is possible to stably manufacture the semiconductor device having a fine wiring structure. In other words, the semiconductor device having high reliability can be manufactured.

Note that, when the metal layer 8 is not formed in the step shown in FIG. 4(e), the metal layer 8 may be formed on the whole top surface of the second barrier metal layer 7 after the step shown in FIG. 5(b). In this case, the electroless plating method is used.

Furthermore, when the metal layer 8 is not formed in the step shown in FIG. 4(e), the external connecting terminal 10 may be formed in the following step. Namely, the metal layer 8 made of Au or platinum group is formed by the electroless plating method on the second barrier metal layer 7 which is exposed on the third opening section 9b so as to mount the solder ball. Then reflow is carried out in the nitrogen atmosphere to form the external connecting terminal 10.

According to the above step, the metal layer for surely connecting the leading wiring layer 12 and the external connecting terminal 10 are formed only at the second barrier metal layer 7 which is exposed on the third opening section 9b.

In other words, the metal layer is formed only in an area where the external connecting terminal 10 is formed. Because of this, even if the metal layer 8 is incorporated in the external connecting terminal 10 by diffusion when the external connecting terminal 10 is formed, this does not create a void between the third insulation layer 9 and the main conductor layer 6, thereby preventing the lowering of the reliability.

Note that, the third insulation layer 9 may not be required when using a method other than the method in which the external connecting terminal 10 is formed by the reflow of the solder ball.

Note that, the semiconductor device of the present invention may be expressed as follows.

Namely, the semiconductor device of the present invention is arranged so as to include (a) the first insulation layer 3 formed on the whole surface of the semiconductor substrate 1 except the first opening section 3c of the section of the electrode pad 2, (b) the main conductor layer 6, on the first insulation layer 3, in which (1) one edge is connected with the electrode pad 2, (2) the other edge is extended to the external connecting terminal 10, (3) the side and bottom surfaces are covered with the first barrier metal layer 5, and (4) the topmost surface is covered with the second barrier metal layer 7, (c) the second insulation layer 4, made of the photosensitive resin, on the side surfaces of the leading wiring layer 12 composed of the main conductor layer 6 and the second barrier metal layer 7, (d) the third insulation layer 9, having the third opening section 9b on the section of the external connecting terminal 10, which is formed so as to cover the leading wiring layer 12 and the second insulation layer 4, wherein the first barrier metal layer 5 and the second barrier metal layer 7 cover whole surfaces around the main conductor layer 6 of the leading wiring layer 12 so as to have a uniform thickness of not less than a certain thickness.

According to the arrangement, since the main conductor layer 6 do not contact the first insulation layer 3, the second insulation layer 4, and the third insulation layer 9, the diffusion of the main conductor layer 6 into the first insulation layer 3, the second insulation layer 4, and the third insulation layer 9 does not occur. Further, the main conductor layer 6 is covered with the first barrier metal layer 5 and the second barrier metal layer 7, thereby preventing the lowering of the reliability due to the oxidation or corrosion of the main conductor layer 6.

Namely, the semiconductor device of the present invention is arranged so as to include the first barrier metal layer 5 on the bottom and side surfaces of the main conductor layer 6, the second barrier metal layer 7 on the top surface of the main conductor layer 6, and the external connecting terminal 10 and the third insulation layer 9 on the surface of the second barrier metal layer 7.

According to this, even though the main conductor layer 6 is made of a material such as Cu, having high electric conductivity, the main conductor layer 6 is entirely covered with the first barrier metal layer 5 and the second barrier metal layer 7, so as to provide the semiconductor device having high reliability which prevents the oxidization of the main conductor layer 6, or the diffusion of the main conductor layer 6 into the organic insulation layer 3b which is an organic insulation layer, the second insulation layer 4, and the third insulation layer 9.

Furthermore, the manufacturing method of the semiconductor device of the present invention may be expressed as follows. Namely, after forming the first insulation layer 3, the second insulation layer 4 is formed, the second insulation layer 4 having an irregular structure having an opening in the electrode pad 2.

Next, after the first barrier metal layer 5 is formed on the whole surface, the main conductor layer 6 is formed. This forms the first barrier metal layer 5 on the side and the bottom surfaces of the main conductor layer 6 in the concave section.

Then, at least the metal layer on the convex section is eliminated mainly by chemicals. After this, it is possible to form the second barrier metal layer 7 on the top surface of the main conductor layer 6 by the electroless plating method.

At this time, if the main conductor layer 6 has a height lower than the second insulation layer 4 before carrying out the electroless plating method, the main conductor layer 6 does not spread sideways due to the plating and does not cause short-circuiting the leading wiring layer 12, thereby allowing the fine wiring structure to be stably formed.

In other words, in the conventional manufacturing method of the semiconductor device, as shown in a schematic diagram of FIG. 6(a), since the top and side surfaces of the main conductor layer 106 are exposed, it is likely that the electroless plating spreads sideways so as to develop the short-circuiting due to remained liquid when the second barrier metal layer 107 is formed on the top surface of the main conductor layer 106 by the electroless plating method.

In the manufacturing method of the semiconductor device of the present invention, however, as shown in a schematic diagram of FIG. 6(b), the side surfaces of the main conductor layer 6 are covered with the second insulation layer 4.

Because of this, even when the second barrier metal layer 7 is formed on the top surface of the main conductor layer 6 by the elctroless plating, it is possible to reduce that the electroless plating spreads sideways and the short-circuiting occurs due to the remained liquid.

Furthermore, in another manufacturing method of the semiconductor device of the present invention, as shown in a schematic diagram of FIG. 6(c), the side surfaces of the main conductor layer 6 are covered with the second insulation layer 4, and the third barrier metal layer 7a is formed on the top surface of the main conductor layer 6 by the electroless substitute plating method.

Because of this, it is further possible to reduce that the electroless substitute plating spreads sideways and the short-circuiting occurs due to the remained liquid.

Note that, the semiconductor device of the present embodiment may be arranged so as to include a metal layer made of gold or platinum group formed at least in a connecting section of the barrier metal layer and the external connecting terminal.

According to the arrangement, when (a) the leading wiring layer, which is composed of the main conductor layer and the first and second barrier metal layers and (b) the external connecting terminal are connected by means of soldering, the metal layer can connect them together more surely in terms of physical properties. This further improves the reliability of the semiconductor device.

Moreover, it is preferable that the semiconductor device is so arranged that the first barrier metal layer is made of alloy of tungsten and titanium.

According to the arrangement, since the first barrier metal layer is made of alloy of tungsten and titanium, even if the insulation layer covering around the first barrier metal layer is an organic insulation layer, adhesion of the insulation layer to the leading wiring layer which is composed of the main conductor layer and the first and the second barrier metal layers, is improved. This prevents the leading wiring layer from being peeled off from the insulation layer to lower the insulation state. Namely, this further improves the reliability of the semiconductor device.

Moreover, it is preferable that the semiconductor device is made of copper, and the second barrier metal layer is made of nickel.

According to the arrangement, in the main conductor layer, it is possible to reduce electric resistance and facilitate its manufacturing, whereas in the second barrier metal layer, it is possible to maintain a barrier function of the main conductor layer and minimize electric resistance.

A manufacturing method of the semiconductor device in accordance with the present invention has the steps of forming an insulation layer, which has an opening section in an area including an area on an electrode pad, on a top surface of the semiconductor substrate on which the electrode pad is formed, at least forming a first barrier metal layer, which becomes a part of a leading wiring layer, in an inner peripheral surface of the opening section including the top surface of the electrode pad, at least forming a main conductor layer, which becomes a part of the leading wiring layer, in an area surrounded by the first barrier metal layer in the opening section, eliminating an upper portion of the main conductor layer at least to a position at which the first barrier metal layer is exposed, and forming a second barrier metal layer, which becomes a part of the leading wiring layer, so as to cover the whole top surface of the main conductor layer.

According to the arrangement, after the first barrier metal layer is formed at a position to cover the bottom and side surfaces of the main conductor layer, the main conductor layer is formed on the first barrier metal layer. At least the upper portions of the main conductor layer is eliminated to a position at which the first barrier metal layer is exposed, and then the second barrier metal layer is formed on the main conductor layer.

This allows the first and the second barrier metal layers to easily and surely cover all the surfaces including the side, bottom and top surfaces of the main conductor layer.

Therefore, the main conductor layer is surely coated with the barrier metal layers so as not to contact the insulation layers, thereby preventing the lowering of the reliability, which is caused when metal diffuses from the main conductor layer into the insulation layers when the insulation layers are formed.

Furthermore, the main conductor layer is surely coated with the barrier metal layers so as not to be subjected to oxidation or corrosion, thereby maintaining adhesion of the leading wiring layer composed of the main conductor layer and the first and the second barrier metal layers to the insulation layers. This improves the reliability of the semiconductor device.

Moreover, the manufacturing method of the semiconductor device in accordance with the present invention is arranged so as to have at least the following sequential steps of (1) forming a first insulation layer, which has a first opening section on an electrode pad where a leading wiring layer is formed, on a semiconductor substrate on which the electrode pad is formed (2) forming a second insulation layer, which has a second opening section where the leading wiring layer is formed, on the first insulation layer (3) forming a first barrier metal layer, which becomes a part of the leading wiring layer, on exposed surfaces of respective layers on the semiconductor substrate including a surface of the electrode pad, (4) forming a main conductor layer, which becomes a part of the leading wiring layer, on a top surface of the first barrier metal layer by plating (5) eliminating portions, of the first barrier metal layer and the main conductor layer, located above a top surface of the second insulation layer by polishing or etching and (6) forming the second barrier metal layer, which becomes a part of the leading wiring layer, by an electroless plating method, so as to cover the exposed top surface of the main conductor layer.

According to the arrangement, after the first barrier metal layer is formed at a position to cover the bottom and side surfaces of the main conductor layer in the steps (1) through (3), the main conductor layer is formed on the first barrier metal layer in the step (4). The second barrier metal layer is then formed on the main conductor layer, which is exposed in the step (5), in the step (6).

These steps allows the first and the second barrier metal layers to easily and surely cover entire surroundings including the side, bottom and top surfaces of the main conductor layer.

Therefore, the main conductor layer is surely coated with the barrier metal layers so as not to contact the insulation layers, thereby preventing the diffusion of the main conductor layer into the insulation layers when the insulation layers are formed.

Furthermore, the main conductor layer is surely coated with the barrier metal layers not to be subjected to oxidation or corrosion, thereby maintaining adhesion of the leading wiring layer composed of the main conductor layer and the first and the second barrier metal layers to the insulation layers. This improves the reliability of the semiconductor device.

Furthermore, when the second barrier metal layer is formed by the electroless plating method on the leading wiring layer connected to the electrode pad, the insulation layers on the side surfaces of the main conductor layer can prevent short-circuiting between the wiring caused by plating expansion at the side surfaces, remained liquid or other reasons.

Namely, it is possible to manufacture a semiconductor device having a fine wiring structure more stably.

The manufacturing method of the semiconductor device in accordance with the present invention has the steps of forming an insulation layer, which has an opening section in an area including an area on an electrode pad, on a semiconductor substrate on which the electrode pad is formed, at least forming a first barrier metal layer, which becomes a part of a leading wiring layer, in an inner peripheral surface of the opening section including a top surface of the electrode pad, at least forming a main conductor layer, which becomes a part of the leading wiring layer, in an area surrounded by the first barrier metal layer in the opening section, forming a second barrier metal layer, which becomes a part of the leading wiring layer, so as to cover the whole surface of the main conductor layer, eliminating portions of respective layers on the insulation layers around the opening section, and forming a third barrier metal layer so as to cover the exposed section of the main conductor layer, which is exposed by the eliminating step.

According to the arrangement, after the first barrier metal layer is formed at a position to cover the bottom and side surfaces of the main conductor layer, the main conductor layer is formed on the first barrier metal layer and then the second barrier metal layer is formed to cover the top surface of the main conductor layer. Following that, portions of the respective layers on the insulation layers around the opening section are eliminated, and then the third barrier metal layer is formed to cover the exposed top surface of the main conductor layer.

This allows the first through the third barrier metal layers to easily and surely cover all the surfaces including the side, bottom and top surfaces of the main conductor layer.

Therefore, the main conductor layer is surely coated with the barrier metal layers so as not to contact the insulation layers, thereby preventing the electromigration between the main conductor layer and the insulation layers.

Furthermore, the main conductor layer is surely coated with the barrier metal layers not to be subjected to oxidation or corrosion, thereby maintaining adhesion of the leading wiring layer composed of the main conductor layer and the barrier metal layers to the insulation layers. This improves the reliability of the semiconductor device.

Moreover, it is preferable that the manufacturing method of the semiconductor device further includes the step of forming a metal layer made of gold or platinum group on a top surface of the second barrier metal layer as a part of the leading wiring layer.

According to the arrangement, the third metal layer ensures securer joining of soldering in terms of physical properties, when soldering is used, for example, for connecting the leading wiring and the external connecting terminal. This allows a semiconductor device having high reliability to be manufactured.

Furthermore, in the manufacturing method of the semiconductor device, the metal layers are manufactured by an electrolytic method, for example, in the steps (4) and (5), whereas the metal layer is formed by an electroless Ni method, for example, only in the step (7), thereby preventing short-circuiting between the wiring.

Furthermore, it is preferable that the manufacturing method of the semiconductor device further includes the steps of forming a third insulation layer, which has a third opening section where an external connecting terminal is formed, as a topmost layer of the respective layers on the semiconductor substrate, and forming a metal layer, which is made of gold or platinum group and is a part of the leading wiring layer, on the exposed barrier metal layer in the third opening section by an electroless plating method.

According to the method, the metal layers for surely connecting the leading wiring and the external connecting terminal are limited to the second barrier metal layer, which is exposed on the third opening section, namely limited to an area where the external connecting terminal is formed.

Because of this, the third metal layer, for example, an Au layer does not exist at a lower portion of the third insulation layer when the external connecting terminal is formed, so as to prevent the lowering of the reliability, which is caused when the metal of the portion is incorporated into the metal of the external connecting terminal, for example, soldering, to create a void between the wiring and the insulation layers.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
   a semiconductor substrate;
   an electrode pad formed on said semiconductor substrate;
   a first insulation layer formed on said semiconductor substrate except for the area having the electrode pad;
   an external connecting terminal;
   a leading wiring layer connecting said external connecting terminal to said electrode pad and formed on a surface, opposite to the semiconductor substrate, of said first insulation layer, said leading wiring layer including a main conductor layer, a first barrier metal layer for covering bottom and side surfaces of the main conductor layer, and a second barrier metal layer for covering a top surface of the main conductor layer, and the first barrier metal layer and the second barrier metal layer cover entire surroundings including the side, bottom and top surfaces of the main conductor layer, and
   the main conductor layer including a base layer and a main layer, which is formed by plating;
   a second insulation layer, formed on said first insulation layer, covering side surfaces of the leading wiring layer substantially to the top surface of the main conductor layer; and
   a third insulation layer formed on said second insulation layer and said leading wiring layer.

2. The semiconductor device as set forth in claim 1, further comprising:
   a metal layer made of gold or platinum group formed at least in a connecting section of the second barrier metal layer and the external connecting terminal.

3. The semiconductor device as set forth in claim 2, wherein:
   the first barrier metal layer is made of alloy of tungsten and titanium.

4. The semiconductor device as set forth in claim 3, wherein:
   the main conductor layer is made of copper, and the second barrier metal layer is made of nickel.

5. The semiconductor device as set forth in claim 1, wherein:
   the first barrier metal layer is made of alloy of tungsten and titanium.

6. The semiconductor device as set forth in claim 1, wherein:
   the main conductor layer is made of copper, and the second barrier metal layer is made of nickel.

7. The semiconductor device as set forth in claim 1, wherein said first insulation layer includes an inorganic insulation film formed on the surface of said semiconductor substrate and an organic insulation layer formed on said inorganic insulation film.

8. The semiconductor device as set forth in claim 7, wherein said inorganic insulation film is made of a nitride.

9. A semiconductor device, comprising: a semiconductor substrate;
   an electrode pad formed on said semiconductor substrate;
   a first insulation layer formed on said semiconductor substrate except for the area having the electrode pad;
   an external connecting terminal;
   a leading wiring layer connecting said external connecting terminal to said electrode pad and formed on a surface, opposite to the semiconductor substrate, of said first insulation layer, said leading wiring layer including a main conductor layer, a first barrier metal layer for covering bottom and side surfaces of the main conductor layer, and a second barrier metal layer for covering a top surface of the main conductor layer, and the first barrier metal layer and the second barrier metal layer cover entire surroundings including the side, bottom and top surfaces of the main conductor layer;

a second insulation layer, formed on the first insulation layer, for covering side surfaces of the leading wiring layer; and a third insulation layer formed on the second insulation layer and on the leading wiring layer without contacting the side surfaces of the first barrier metal layer.

10. The semiconductor device as set forth in claim 9, further comprising:

a metal layer made of gold or platinum group formed at least in a connecting section of the second barrier metal layer and the external connecting terminal.

11. The semiconductor device as set forth in claim 10, wherein:

the first barrier metal layer is made of alloy of tungsten and titanium.

12. The semiconductor device as set forth in claim 11, wherein:

the main conductor layer is made of copper, and the second barrier metal layer is made of nickel.

13. The semiconductor device as set forth in claim 9, wherein:

the first barrier metal layer is made of alloy of tungsten and titanium.

14. The semiconductor device as set forth in claim 9, wherein:

the main conductor layer is made of copper, and the second barrier metal layer is made of nickel.

15. The semiconductor device as set forth in claim 9, wherein said first insulation layer includes an inorganic insulation film formed on the surface of said semiconductor substrate and an organic insulation layer formed on said inorganic insulation film.

16. The semiconductor device as set forth in claim 15, wherein said inorganic insulation film is made of a nitride.

* * * * *